(12) United States Patent
Nabatame et al.

(10) Patent No.: US 7,397,094 B2
(45) Date of Patent: Jul. 8, 2008

(54) SEMICONDUCTOR DEVICE AND MANUFACTURING METHOD THEREOF

(75) Inventors: Toshihide Nabatame, Tsukuba (JP); Akira Toriumi, Yokohama (JP); Tsuyoshi Horikawa, Tsukuba (JP); Kunihiko Iwamoto, Kyoto (JP); Koji Tominaga, Kyoto (JP)

(73) Assignees: Renesas Technology Corporation, Tokyo (JP); National Institute of Advanced Industrial Science and Technology, Tokyo (JP); Rohm Co., Ltd., Kyoto (JP); Horiba., Ltd., Kyoto (JP)

(*) Notice: Subject to any disclaimer, the term of this patent is extended or adjusted under 35 U.S.C. 154(b) by 217 days.

(21) Appl. No.: 11/114,195

(22) Filed: Apr. 26, 2005

(65) Prior Publication Data

US 2005/0236675 A1 Oct. 27, 2005

(30) Foreign Application Priority Data

Apr. 27, 2004 (JP) ............................. 2004-130834

(51) Int. Cl.
- *H01L 29/76* (2006.01)
- *H01L 29/94* (2006.01)
- *H01L 31/062* (2006.01)
- *H01L 31/113* (2006.01)
- *H01L 31/119* (2006.01)

(52) U.S. Cl. ....................... 257/406; 257/410; 257/411; 257/E29.165

(58) Field of Classification Search ................. 257/406, 257/410, 411, E29.165
See application file for complete search history.

(56) References Cited

U.S. PATENT DOCUMENTS 7,189,660 B2 * 3/2007 Hirano ....................... 438/761
2005/0233526 A1 * 10/2005 Watanabe et al. ........... 438/287

FOREIGN PATENT DOCUMENTS

| JP | 11-135774 | 7/1998 |
| JP | 2003-347297 | 5/2002 |
| JP | 2004-311782 | 4/2003 |
| JP | 2004-165668 | 11/2003 |

* cited by examiner

*Primary Examiner*—Thien F Tran
(74) *Attorney, Agent, or Firm*—Reed Smith LLP; Stanley P. Fisher, Esq.; Juan Carlos A. Marquez, Esq.

(57) ABSTRACT

To provide a semiconductor device that enables to suppress a defect density of a gate insulating film of an MISFET, gain a sufficient electric characteristic thereof, and make an Equivalent Oxide Thickness (EOT) of the gate insulating film 1.0 nm or less. The MISFETs are formed to have the gate insulating film formed on a main surface of a silicon substrate, and a gate electrode formed on the gate insulating film, wherein the gate insulating film includes a metal silicate layer formed by a metal oxide layer and a silicon oxide layer and the metal silicate layer is formed so as to have concentration gradients of metal and silicon from a silicon substrate side toward a gate electrode side.

16 Claims, 4 Drawing Sheets

SEMICONDUCTOR DEVICE AND MANUFACTURING METHOD THEREOF

CROSS-REFERENCE TO RELATED APPLICATION

The present application claims priority from Japanese patent application No. JP 2004-130834 filed on Apr. 27, 2004, the content of which is hereby incorporated by reference into this application.

BACKGROUND OF THE INVENTION

The present invention relates to a semiconductor device and a manufacturing method thereof and specifically to a technique effectively applied to both of a Metal Insulator Semiconductor (MIS) type field effect transistor (MISFET) and a manufacturing technique of the same.

With the trend toward high speed and highly integrated semiconductor integrated circuits, it is required to make a gate insulating film of an MISFET thin. However, when an silicon oxide film with a low dielectric constant that is used a gate insulating film is made thin, there arises the problem that a gate leak current increases owing to direct tunneling.

SUMMARY OF THE INVENTION

Therefore, examinations are made on the introduction of a high-dielectric-constant gate insulating film such as a hafnium silicate (HfSiOx) film that enables to decrease Equivalent Oxide Thickness (EOT) of the gate insulating film and enables to increase physical thickness and thereby suppress a gate leak current (see Japanese Patent Laid-open No. 11-135774 and No. 2003-347297).

For improvement of reliability, it is required for the gate insulating film of the MISFET to be amorphous. Therefore, in order to attain this, it is considered to be important to suppress crystallization of the gate insulating film in a heat treatment step in a manufacturing process for the gate insulating film.

However, so as to attain sufficiently an electric characteristic such as mobility for the MISFET, it has been necessary to form an silicon oxide layer with a thickness of approximately 1.0 nm on a silicon wafer. As a result, the EOT of the gate insulating film becomes as large as approximately 1.5 nm or higher, and the EOT required by a 45 nm technology node cannot be achieved in the range of 1.0 nm or below. Note that, as methods of forming gate insulating films, there are generally employed a spattering method, and a Chemical Vapor Deposition (CVD) method, etc. However, it is considered that these methods have difficulties in meeting the requirement toward thin films.

Accordingly, an object of the present invention is to provide a technique capable of suppressing a defect density of a gate insulating film, gain the sufficient electric characteristic for the MISFET, and make it possible the EOT of the gate insulating film to be 1.0 nm or below.

The above and other objects and novel features of the present invention will be apparent from the description of the specification and the accompanying drawings.

Outlines of representative ones of the inventions disclosed in the present application will be briefly described as follows.

A semiconductor device according to the present invention is provided with an MISFET having a silicon substrate, a gate insulating film formed over a main surface of the silicon substrate, and a gate electrode formed over the gate insulating film, the device comprising the gate insulating film including a metal silicate layer formed by a silicon oxide layer and a metal oxide layer, wherein silicon and metal composing the metal silicate layer have concentration gradients from a side of the silicon substrate toward a side of the gate electrode.

Also, in the semiconductor device according to the present invention, an Equivalent Oxide Thickness (EOT) of the gate insulating film is 1.0 nm or less.

Further, in the semiconductor device according to the present invention, the metal oxide layer or silicon oxide layer is formed by an Atomic Layer Deposition (ALD) method.

Effects obtained by representative ones of inventions disclosed in the present application will be briefly described as follows.

It is possible to suppress the defect density of the gate insulating film, gain the sufficient electric characteristics for the MISFET, and make it possible the EOT of the gate insulating film to be 1.0 nm or less.

DESCRIPTION OF THE PREFERRED EMBODIMENTS

Figure 1:
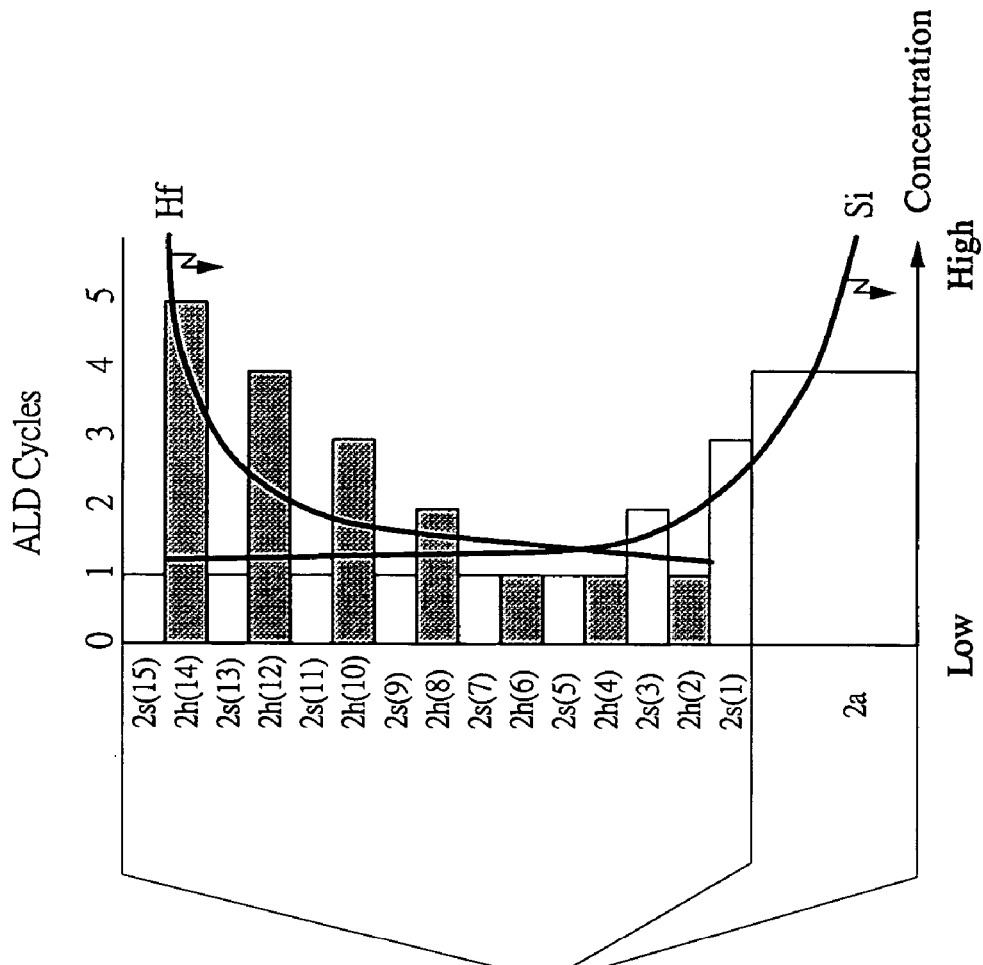
FIG. 1A is a cross-sectional view showing a principal portion of an MISFET that is a first embodiment of the present invention.
FIG. 1B is a view of a concentration distribution of component elements of a gate insulating film.

Hereinafter, embodiments of the present invention will be detailed based on the drawings. Note that, throughout all the drawings for explaining the embodiments, the same members are denoted in principle by the same reference numeral, and the repetitive explanation thereof will be omitted.

First Embodiment

In a first embodiment of the present invention, an MISFET in which component elements of a gate insulating film have a concentration distribution and a manufacturing method thereof will be described with reference to FIGS. 1, 2, and 3.

FIG. 1A is a cross-sectional view showing a principle portion of an MISFET according to a first embodiment and FIG. 1B shows a view of the concentration distribution of component elements of the gate insulating film.

A silicon substrate 1 shown in FIG. 1A is subjected to a dilute fluoric acid treatment. On a main surface of the silicon substrate 1, a gate insulating film 2 having a silicon oxide ($SiO_2$) layer 2a and a hafnium silicate (HfSiOx) layer 2sh is formed. On this gate insulating film 2, a gate electrode 3 is formed by, for example, polycrystalline silicon. Note that hafnium silicate (HfSiOx) is a metal silicate of which a component element is hafnium (Hf), and its dielectric constant is within a range of approximately 3.9 (dielectric constant of silicon oxide ($SiO_2$)) to approximately 25 (dielectric constant of hafnium oxide ($HfO_2$)) due to a composition ratio of hafnium and silicon (Hf:Si).

Herein, a description will be made of being capable of suppressing defects occurring at an interface between the silicon substrate 1 and the gate insulating film 2 when the gate insulating film 2 of the first embodiment is formed on the main surface of the silicon substrate 1.

The hafnium silicate layer 2sh is formed so that a concentration of silicon (Si), which is its component element, becomes relatively higher in an area on a side of the silicon substrate 1 (silicon oxide layer 2a) than in an area on a side of the gate electrode 3 wherein there is a concentration distribution having a gradually lower gradient from the silicon substrate 1 toward the gate electrode 3. Meanwhile, the hafnium silicate layer 2sh is formed so that a concentration of hafnium (Hf), which is its component element, becomes relatively lower in an area on a side of the silicon substrate 1 (silicon oxide layer 2a) than in an area on a side of the gate electrode 3 wherein there is a concentration distribution having a gradually higher gradient from the silicon substrate 1 toward the gate electrode 3.

Accordingly, as shown in FIG. 1B, the gate insulating film 2 including the hafnium silicate layer 2sh having the above-mentioned concentration distribution has the silicon oxide layer 2a on the silicon substrate 1. Therefore, the concentration of Si, which is a component element of the gate insulating film 2, is distributed to become relatively higher in the area on the side of the silicon substrate 1 than in that of the gate electrode 3 and further the concentration distribution of Si is formed to have a gradually smaller gradient from the silicon substrate 1 toward the gate electrode 3. Meanwhile, the gate insulating film 2 including the hafnium silicate layer 2sh having the above-mentioned concentration distribution has the silicon oxide layer 2a on the silicon substrate 1. Therefore, the concentration of Hf, which is its component element, is distributed to become further relatively lower in the area on the side of the silicon substrate 1 than in that of the gate electrode 3 and further the concentration distribution of Hf is formed to have a gradually larger gradient from the silicon substrate 1 toward the gate electrode 3.

The gate insulating film 2, which is described in the present embodiment, i.e., which has the continuous concentration distributions of the component elements of the gate insulating film 2 from the silicon substrate 1 toward the gate electrode 3, can suppress a conventional problem, namely, suppress fixed electric charges caused by defects occurring on a sharp interface between an $SiO_2$ layer and an $HfO_2$ component layer. Further, the $SiO_2$ component, which has a small defect density and is capable of forming the preferable interface even if it contacts with an $SiO_2$ substrate, exists much on the side of the silicon substrate 1, so that the density of defects occurring on the interface between the gate insulating film 2 and the silicon substrate 1 can be made low. In addition, because the $HfO_2$ component composing a high dielectric constant insulating film exists much on the side of the gate electrode 3e, it can be used as a high dielectric constant insulating film.

Next, it will be described that the gate insulating film 2 of the first embodiment can attain EOT of 1.0 nm or less.

Herein, the first embodiment shows the case where the hafnium silicate layer 2sh is formed so that the composition ratio of hafnium and silicon which are the component elements of the hafnium silicate layer 2sh (ratio of Hf:Si) can become 8:9, 12:10, and 16:11. In this case, a dielectric constant k of the hafnium silicate layer 2sh is set to approximately 13 at Hf:Si=8:9, approximately 14 at 12:10, and approximately 15 at 16:11.

Under these conditions, in order for the EOT of the gate insulating film 2 to attain 1.0 nm or less, it is necessary to precisely control physical thickness of the gate insulating film 2, especially, physical thickness of the hafnium silicate layer 2sh.

Further, to solve the problems described above by the present invention, i.e., in order to suppress the defects occurring on the interface between the silicon substrate 1 and the gate insulating film 2 as described above, it is necessary to form the gate insulating film 2 controlled so that the component elements of the gate insulating film 2 has the concentration distributions from the silicon substrate 1 toward the gate electrode 3.

Therefore, the hafnium silicate layer 2sh must be formed by a method of being deposited with atomic-layer level precision and, in the first embodiment, it is formed by using, for example, an Atomic Layer Deposition (ALD) method. This ALD method is a method of: supplying respective raw material gases not simultaneously but alternatively; thereby controlling surface absorption and surface reaction of each raw material gas on the main surface of the silicon 1 at a monolayer level; and making atomic layers or molecular layers grow per layer. Note that although the first embodiment employs the ALD method, it may employ an intermittent type CVD method. Hereinafter, an MIS structure shown in the first embodiment will be described together with a manufacturing technique thereof by using FIG. 2. FIG. 2 is an enlarged cross-sectional view of a principle portion of the MIS structure in the first embodiment.

Figure 2:
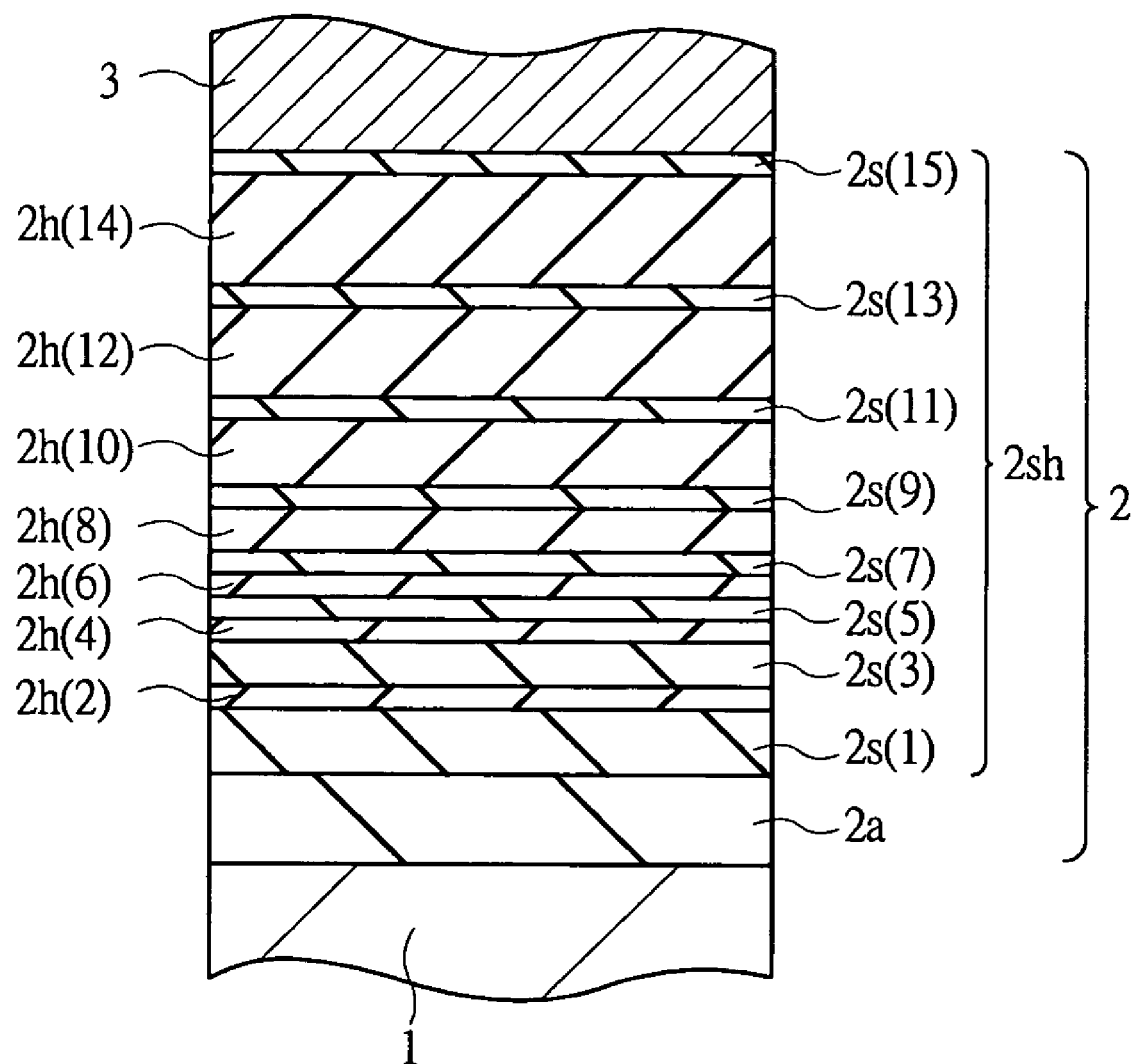
FIG. 2 is a cross-sectional view showing a manufacturing technique for a MIS structure in the first embodiment.

As shown in FIG. 2, the silicon oxide layer 2a on the main surface of the silicon substrate 1 is formed, for example, by a chemical processing ($NH_4OH$ solution and the like), on the main surface of the silicon substrate 1 to have a size of, for example, approximately 4 Angstroms (Å) as an atomic layer. In the first embodiment, the thickness of the silicon oxide layer 2a is preferably optimized in order that the EOT of the gate insulating film 2 is made 1.0 nm or less and in order to suppress the defects occurring on the interface between the gate insulating film 2 and the silicon substrate 1. Note that although the silicon oxide layer 2a is formed on the main surface of the silicon substrate 1 by the chemical processing in the first embodiment, it may be formed by a heat treatment in an oxidizing atmosphere within a range of approximately 800° C. to approximately 1000° C.

Next, on this silicon oxide layer 2a, the hafnium silicate layer 2sh is formed. In this hafnium silicate layer 2sh, silicon oxide layers 2s and hafnium oxide layers 2h are deposited alternatively at the atomic-layer level by using the ALD method. Note that reference numerals in parentheses, which are shown after the silicon oxide layers 2s and the hafnium oxide layers 2h, indicate numbers of layers deposited sequentially from the silicon oxide layer 2a.

As shown in FIG. 2, on the silicon oxide layer 2a, a silicon oxide layer 2s (1) is formed. This silicon oxide layer 2s (1) is formed by: using the ALD method to introduce a Si raw material gas, an $N_2$ purge gas, an Oxygen reactive gas, and an $N_2$ purge gas sequentially onto the main surface of the silicon substrate 1; and if such sequential gas introduction is regarded as one cycle, carrying out it three times (three cycles). Note that, for example, tetra metxy silan Si $(OCH_3)_4$ is used as the Si raw material gas and water $H_2O$ is employed as the Oxygen reactive gas.

On this silicon oxide layer 2s (1), a hafnium oxide ($HfO_2$) layer 2h (2) is formed. This hafnium oxide layer 2h (2) is formed by using the ALD method to introduce the Hf raw material gas, $N_2$ purge gas, Oxygen reactive gas, and $N_2$ purge gas sequentially onto the main surface of the silicon substrate 1; and if such sequential gas introduction is regarded as one cycle, carrying out it once (one cycle). Note that, for example, tetra-dimethyl-amino-hafnium $Hf[N(CH_3)_2]_4$ is used as the Hf raw material gas and water $H_2O$ is employed as the Oxygen reactive gas.

Thus, in the case of using the ALD method, by arbitrarily controlling the number of cycles for depositing the silicon oxide layers 2s and the hafnium oxide layers 2h, the ratio of Hf to Si in the hafnium silicate layer can be made desired values (in the first embodiment, the ratio of Hf:Si is set to 8:9, 12:10, or 16:11). In addition, by depositing the silicon oxide layers 2s and the hafnium oxide layers 2h sequentially, the concentration distributions of Si and Hf which are the component elements of the hafnium silicate layer 2sh can be formed so as to have some gradients.

Thereafter, by using the ALD method in the same manners, the silicon oxide layers 2s and the hafnium oxide layers 2h are formed sequentially on the main surface of the silicon substrate 1. On the hafnium oxide layer 2h (2), a silicon oxide layer 2s (3) is formed by carrying out the gas introduction two cycles.

Then, on the silicon oxide layer 2s (3), a hafnium oxide layer 2h (4) is formed by carrying out it one cycle.

Next, on the hafnium oxide layer 2h (4), a silicon oxide layer 2s (5) is formed by one cycle.

Thereafter, on the silicon oxide layer 2s (5), a hafnium oxide layer 2h (6) is formed by one cycle.

Subsequently, on the hafnium oxide layer 2h (6), a silicon oxide layer 2s (7) is formed by one cycle.

Then, on the silicon oxide layer 2s (7), a hafnium oxide layer 2h (8) is formed by two cycles.

Next, on the hafnium oxide layer 2h (8), a silicon oxide layer 2s (9) is formed by one cycle.

Thereafter, on the silicon oxide layer 2s (9), a hafnium oxide layer 2h (10) is formed by three cycles.

Subsequently, on the hafnium oxide layer 2h (10), a silicon oxide layer 2s (11) is formed by one cycle.

Then, on the silicon oxide layer 2s (11), a hafnium oxide layer 2h (12) is formed by four cycles.

Next, on the hafnium oxide layer 2h (12), a silicon oxide layer 2s (13) is formed by one cycle.

Thereafter, on the silicon oxide layer 2s (13), a hafnium oxide layer 2h (14) is formed by five cycles.

Subsequently, on the hafnium oxide layer 2h (14), a silicon oxide layer 2s (15) is formed by one cycle.

Thus, by depositing the silicon oxide layers 2s and the hafnium oxide layers 2h alternatively on the silicon oxide layer 2a, the hafnium silicate layer 2sh is formed. Therefore, the gate insulating film 2 including the silicon oxide layer 2s and the hafnium oxide layer 2sh is formed on the main surface of the silicon substrate 1.

In the first embodiment, the hafnium silicate layer 2sh is formed so that the ratio of Hf:Si in the hafnium silicate layer becomes 8:9, 12:10, and 16:11, and the physical film thicknesses of the hafnium silicate layer 2sh are then deposited up to approximately 17 Angstroms (first to eleventh layers), approximately 22 Angstroms (first to thirteenth layers), and 27 Angstroms (first to fifteenth layers), respectively. Accordingly, the EOTs of the gate insulating film 2 including the silicon oxide layer 2a (physical film thickness of approximately 4 Angstroms) can be set to approximately 0.9 nm, 1.0 nm, and 1.1 nm, respectively.

Next, a gate electrode 3 is formed on the gate insulating film 2. This gate electrode 3 is formed of polycrystal silicon by using, for example, the CVD method.

Through the process heretofore, the MIS structure is roughly completed.

Note that, in the MIS structure shown in FIG. 2, the hafnium silicate layer 2sh is formed by depositing fifteen layers composed of the silicon oxide layers 2s and the hafnium oxide layers 2h (ratio of Hf:Si is 16:11). However, when the hafnium silicate layer 2sh is formed by depositing fifteen layers of the silicon oxide layers 2s and the hafnium oxide layers 2h (ration of Hf:Si is 12:10) or eleven layers (ration of Hf:Si is 8:9), the gate electrode 3 is formed on an upper surface of the hafnium silicate layer, whereby the MIS structure is roughly completed.

Figure 3:
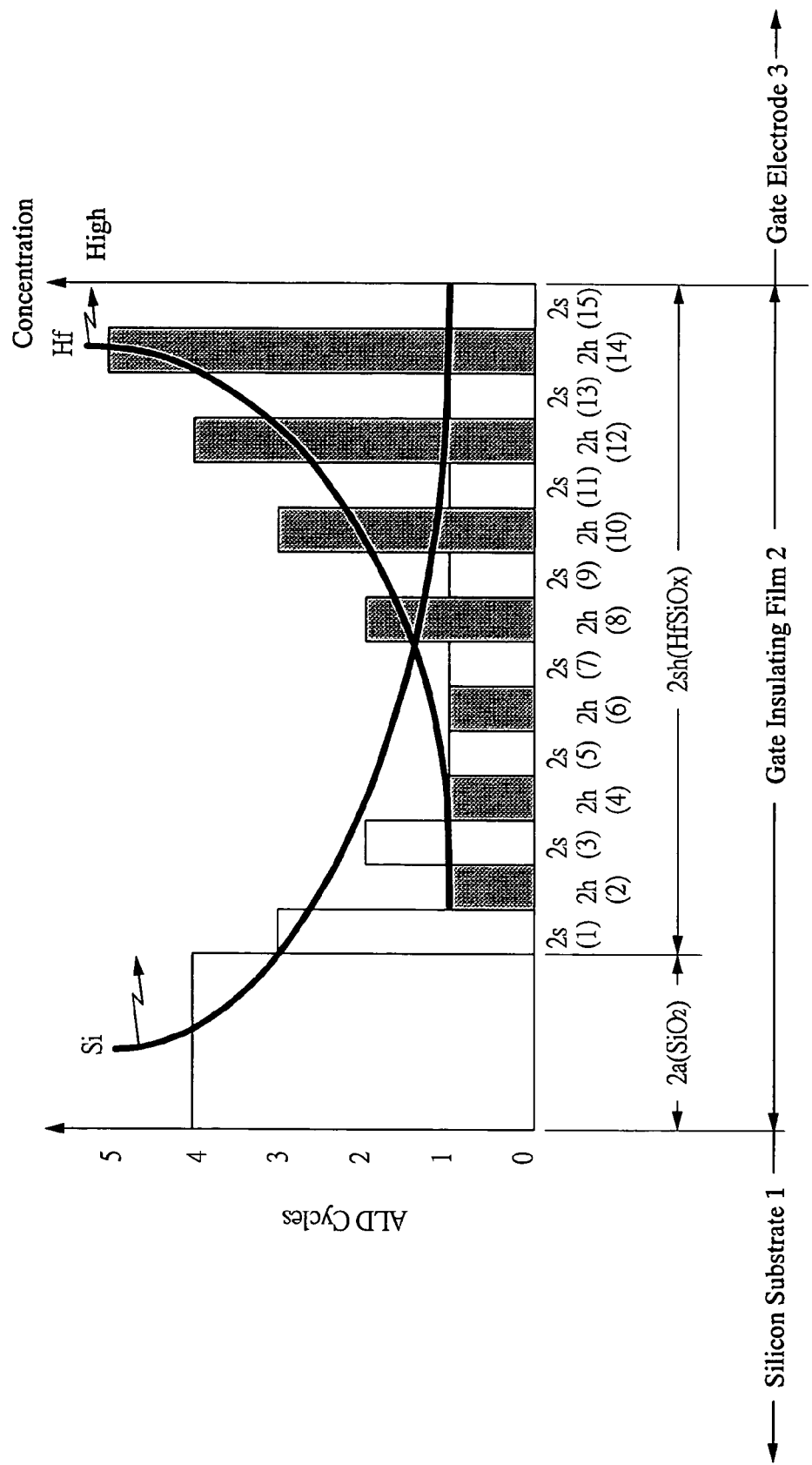
FIG. 3 is a view of a concentration distribution of component elements of the gate insulating film in the first embodiment.

FIG. 3 shows a relation among layers (silicon oxide layer 2a, silicon oxide layers 2s, and hafnium oxide layers 2h) deposited from the main surface of the silicon substrate 1 toward the gate electrode 3, the number of ALD cycles, and concentrations of component elements contained in the gate insulating film 2, in the above-mentioned MIS structure of the first embodiment. Note that although the silicon oxide layer 2a is formed by the chemical processing, the silicon oxide layer 2a is illustrated together with the hafnium silicate layer 2sh since the gate insulating film 2 is composed of the silicon oxide layer 2a and the hafnium silicate layer 2sh.

In FIG. 3, curves showing concentration gradients of hafnium (Hf) and silicon (Si), which are the component elements of the hafnium silicate layer 2sh, are illustrated. The gate insulating film 2 including the hafnium silicate layer 2sh having such concentration distributions has the silicon layer 2a on the silicon substrate 1. Therefore, the concentration of Hf that is the component element is distributed so as to be relatively lower in the area on the side of the silicon substrate 1 (side of the silicon oxide layer 2a) than in that of the gate electrode 3 wherein the concentration distribution of Hf is formed so as to have a gradually higher gradient from the silicon substrate 1 toward the gate electrode 3. Meanwhile, the gate insulating film 2 including the hafnium silicate layer 2sh having the above-mentioned concentration distribution has the silicon oxide layer 2a on the silicon substrate 1. Accordingly, the concentration of Si that is the component element of the gate insulating film 2 is distributed so as to become relatively higher in the area on the side of the silicon substrate 1 than in that of the gate electrode 3 wherein the concentration distribution of Si is formed so as to have a gradually lower gradient from the silicon substrate 1 toward the gate electrode 3. Note that FIG. 1B also has the same concentration distributions.

For this reason, by using the manufacturing technique shown in the first embodiment, it is possible to form the gate insulating film in which the component elements of the gate insulating film have the concentration distributions from the silicon substrate toward the gate electrode.

Further, even if the silicon oxide layer with a thickness of approximately 1.0 nm could not be formed on a silicon wafer, the EOT of the gate insulating film 2 can be made 1.0 nm or less by adjusting the ratio of Hf:Si and the physical film thickness of the hafnium silicate layer 2sh.

Accordingly, the component elements of the gate insulating film 2 have the concentration distributions from the silicon substrate 1 toward the gate electrode 3, so that a lattice mismatching between the silicon substrate 1 and the high-dielectric-constant hafnium silicate layer 2sh is suppressed and the defect density is reduced and an influence by carrier diffusion is decreased and consequently high mobility can be obtained.

As described above, the MISFET to become the MIS structure shown in the first embodiment has, as a gate insulating film, the hafnium silicate layer having gradually higher concentrations of hafnium from on the silicon substrate and its concentration gradients are controlled at the atomic layer level. Accordingly, the conventional hafnium silicate film with a fixed composition ratio of hafnium and silicon has the high defect density caused by the sharp concentration gradient on the SiO$_2$ interface, whereas the preferable gate insulating film with the small defect density can be formed in the present invention. Note that, the MISFET according to the first embodiment has attained 80% or higher with respect to the mobility of a MISFET in which silicon oxide is used as the gate insulating film, the MISFET of the first embodiment has attained 80% or higher.

Further, if the hafnium silicate layer having such concentration gradients is formed up to approximately 1.0 nm, the preferable gate insulating film with the small defect density can be formed even when a high-dielectric-constant film of another kind, for example, the hafnium oxide film is formed on the hafnium silicate layer.

Second Embodiment

In a second embodiment of the present invention, an example of a manufacturing technique of a Complementary Metal Oxide Semiconductor (CMOS) device including the MISFET in which the component elements of the gate insulating film have concentration distributions will be described in order of processes with reference to FIG. 4.

Figure 4:
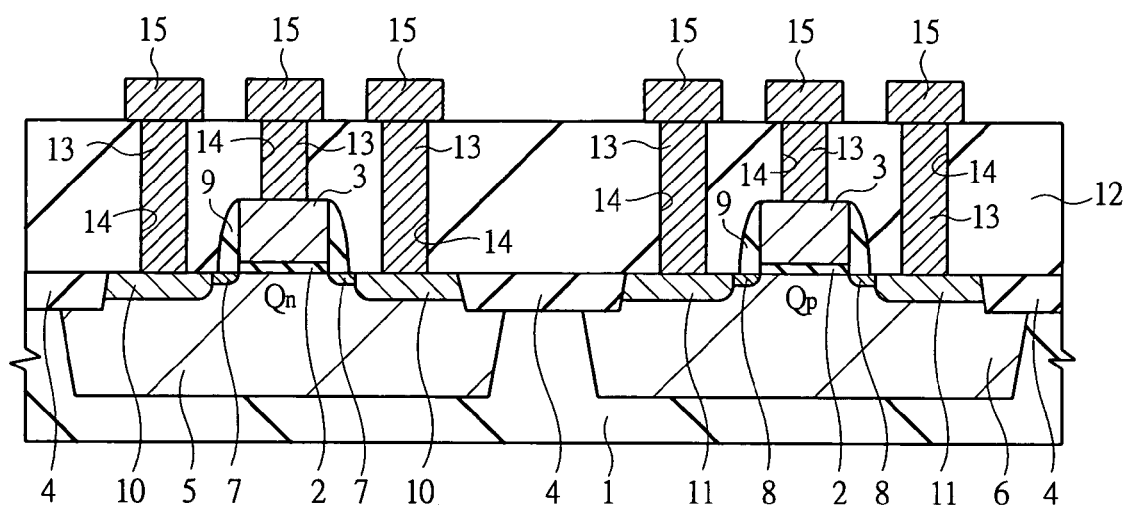
FIG. 4 is a cross-sectional view showing a manufacturing process for a semiconductor device, which is a second embodiment of the present invention.

First, as shown in FIG. 4, a silicon substrate (semiconductor wafer formed into a thin circular plate), for example, the silicon substrate 1 obtained by introducing a p-type impurity such as boron (B) into monocrystal silicon is prepared. Note that the main surface of the silicon substrate 1 is subjected to the dilute fluoric acid treatment.

Next, an element isolation area 4 is formed on the main surface of the silicon substrate 1. That is, the element isolation area 4 is formed by using, for example, an etching technique to form grooves in the main surface of the silicon substrate 1, thereafter using, for example, the Chemical Vapor Deposition (CVD) method to deposit a silicon oxide film for being embedded into the grooves, and using the Chemical Mechanical Polishing (CMP) method to planarize a surface of the deposited silicon oxide film.

Next, a p-type well 5 and an n-type well 6 are formed in the silicon substrate 1. The p-type well 5 is formed, for example, by using a photolithography technique and an ion implantation method to introduce a p-type impurity such as boron and boron fluoride into the silicon substrate 1. In the same manner, the n-type well 6 is formed, for example, by using the photolithography technique and the ion implantation method to introduce an n-type impurity such as phosphorus (P) and arsenic (As) into the silicon substrate 1.

Next, a gate insulating film 2 is formed on the silicon substrate 1. The gate insulating film 2 has a silicon oxide layer 2 and a hafnium oxide silicate layer 2sh (see FIG. 2).

The silicon oxide layer 2a is formed up to, for example, a thickness of approximately 4 Angstroms on the main surface of the silicon substrate 1 by performing the chemical treatment, for example, a treatment by $NH_4OH$ solution or $N_2O_2$ solution to the main surface of the silicon substrate 1.

The hafnium silicate layer 2sh includes the silicon oxide layers 2s and the hafnium oxide layers 2h at the atomic layer level and is formed by depositing the silicon oxide layers 2s and the hafnium oxide layers 2h alternatively. This hafnium silicate layer 2sh is formed by using the Atomic Layer Deposition (ALD) method. Note that a process for forming the hafnium silicate layer 2sh is made in the same manner as the manufacturing process of the MIS structure shown in the first embodiment.

As shown in the first embodiment, the hafnium silicate layer 2sh is formed to have thicknesses of approximately 17 and 22 Angstroms when the ratio of Hf:Si is set to, for example, 8:9 and 12:10, respectively, so that the EOT of the gate insulating film 2 can be made 1.0 nm or less. Note that the concentration gradients of this gate insulating film 2 is obtained by changing the ratio of repetition of the process for forming the silicon oxide layers 2s and the process for forming the hafnium oxide layers 2h.

By performing the heat treatment using, for example, an ammonia ($NH_3$) gas as an ambient gas after the gate insulating film 2 is formed, nitrogen (N) is added to the gate insulating film 2. By adding nitrogen (N) to the gate insulating film 2, heat resistance of the gate insulating film 2 can be improved. Note that silicon and metal composing the gate insulating film 2 have concentration gradients from the silicon substrate 1 toward the gate electrode 3 and, even after the heat treatment, have concentration gradients from the silicon substrate 1 toward the gate electrode 3.

Next, as shown in FIG. 4, the gate electrode 3 is formed on the gate insulating film 2. The gate electrode 3 is formed by using, for example, the CVD method to form polycrystal silicon, using a photolithography technique and the ion implantation method to make and divide the formed polycrystal silicon per conductivity type, and then being subjected to the photolithography technique and the dry etching.

Next, a low-concentration n-type impurity diffusion area 7 and a low-concentration p-type impurity diffusion area 8, which are semiconductor areas, are formed in the silicon substrate 1. The low-concentration p-type impurity diffusion area 8 is formed, for example, by using the photolithography technique and the ion implantation method to introduce a p-type impurity such as boron and boron fluoride into the n-type well 6 in the silicon substrate 1. In the same manner, the low-concentration n-type impurity diffusion area 7 is formed, for example, by using the photolithography technique and the ion implantation method to introduce an n-type impurity such as phosphorus and arsenic into the p-type well 5 in the silicon substrate 1.

Next, on the main surface of the silicon substrate 1, sidewalls 9 are formed on side walls of the respective gate electrodes 3. This sidewall 9 is formed, for example, by using a plasma CVD method to form a silicon nitride film and thereafter performing an anisotropic etching to this silicon nitride film. Note that although being formed of the silicon nitride film, the sidewall 9 is not limited to it and may be formed of, for example, a silicon oxide film, a silicon oxynitride film, or a laminated film of the silicon oxide film and the silicon nitride film.

Next, a high-concentration n-type impurity diffusion area 10 and a high-concentration p-type impurity diffusion area 11 are formed in areas of the silicon substrate 1 so as to correspond to the sidewalls 9, respectively. The high-concentration p-type impurity diffusion area 11 is formed, for example, by using the photolithography technique and the ion implantation method, and a p-type impurity such as boron is introduced therein so that the high-concentration p-type impurity diffusion area has a higher concentration than the low-concentration p-type impurity diffusion area 8. In the same manner, the high-concentration n-type impurity diffusion area 10 is formed, for example, by using the photolithography technique and the ion implantation method, and an n-type impurity such as phosphorus and arsenic is introduced therein so that the high-concentration n-type impurity diffusion area has a higher concentration than the low-concentration n-type impurity diffusion area 7.

Next, on the main surface of the silicon substrate 1, an interlayer insulating film 12 made of a silicon oxide film is formed. This interlayer insulating film 12 may be formed by, for example, the CVD method. Thereafter, the surface of the interlayer insulating film 12 is made flat by using the CMP method.

Then, plugs 13 are formed in the interlayer insulating film 12. Each plug 13 is formed by: using use of the photolithography technique and etching technique to form a contact hole 14 in the interlayer insulating film 12, hereafter using, for example, the spattering method to form a titanium/titanium nitride film on a bottom surface and an inside wall of the contact hole 14; and further using the CVD method to deposit a tungsten film for being embedded into the contact hole 14. Note that the unnecessary titanium/titanium nitride film and tungsten film deposited on the interlayer insulating film 12 are removed by using, for example, the CMP method.

Next, wirings 15 are formed on the main surface of the silicon substrate 1. The wirings 15 are formed by using, for example, the spattering method to deposit a titanium/titanium nitride film, an aluminum film, and a titanium/titanium nitride film on the main surface of the silicon substrate 1. Subsequently, by using the photolithography technique and etching technique, these films are patterned and thereby the wirings 15 are formed.

By the processes heretofore, a p-channel type MISFET Qp is formed in the n-type well 6 and an n-channel type MISFET Qn is formed in the p-type well 5. Note that since the same processes as those of the interlayer insulating film 12, plugs 13, and wirings 15 are repeated after the wirings 15 are formed, a multilayer wiring is formed over the wirings 15 and finally the entire silicon substrate 1 is covered with a passivation film, whereby a CMOS device is roughly completed.

Since the semiconductor device having a gate-insulating-film structure having the concentration gradients according to the present invention is used, a reduction in the defect density becomes possible and consequently the high mobility can be obtained, so that the semiconductor device with low power consumption can be manufactured.

As described above, the invention made by the present inventors has been described based on the embodiments. However, needless to say, the present invention is not limited to the above embodiments and can be variously altered and modified without departing from the gist thereof.

In the above embodiments, descriptions have been made of applying hafnium silicate (HfSiOx) to a metal silicate layer. However, another metal silicate layer including at least one selected from a group of, for example, Zr, Ta, Al, Ti, Nb, Sc, Y, La, Ce, Pr, Nd, Sm, Eu, Gd, Tb, Dy, Ho, Er, Tm, Yb, and Lu may be used instead of the above-mentioned metal silicate layer.

Further, in the above embodiments, in order to form the gate insulating film on the main surface of the semiconductor substrate, the ALD method is employed as a method of being deposited with the atomic-layer-level accuracy. However, instead thereof, an intermittent type CVD method may be employed. Namely, by introducing a purge gas, respective growth speeds of the silicon oxide layers and the hafnium oxide layers can be suppressed, so that the silicon oxide layers and the hafnium oxide layers can be formed at the atomic layer level in the same manners as in the case of using the ALD method and, consequently, the same results as those shown in the embodiments can be obtained.

The manufacturing technique of the MISFET according to the present invention may be used widely in a manufacture field for manufacturing the semiconductor devices. The manufacturing technique of the MISFET according to the present invention may be applied to, for example, low power-consumption elements, low standby-power elements, and high-speed elements.

What is claimed is:

1. A semiconductor device provided with a MISFET having:

a silicon substrate;
a gate insulating film formed over a main surface of said silicon substrate; and
a gate electrode formed over said gate insulating film,
wherein said gate insulating film includes a first insulating film formed over said silicon substrate and a metal silicate layer formed over said first insulating film,
wherein said metal silicate layer is composed of a plurality of silicon oxide layers alternatingly laminated with a plurality of metal oxide layers, each of the plurality of silicon oxide layers being laminated so as to be adjacent to at least one corresponding metal oxide layer,
wherein one of said metal oxide layers formed closest to said gate electrode is thicker than another one of said metal oxide layers formed closest to said silicon substrate,
wherein a concentration of silicon in said metal silicate layer is distributed to become higher on a silicon-substrate side than on a gate-electrode side,
wherein a concentration of metal in said metal silicate layer is distributed to become lower on the silicon-substrate side than on the gate-electrode side, and
wherein an Equivalent Oxide Thickness (EOT) of said gate insulating film is 1.0 nm or less.

2. A semiconductor device according to the claim 1, wherein said metal oxide layers are formed by an ALD (Atomic Layer Deposition) method.

3. A semiconductor device according to the claim 1, wherein said first insulating film is formed of a silicon oxide film.

4. A semiconductor device according to the claim 1, wherein said metal oxide layers include Hf.

5. A semiconductor device according to the claim 1, wherein said metal oxide layers include one of Zr, Ta, Al, Ti, Nb, Sc, Y, La, Ce, Pr, Nd, Sm, Eu, Cd, Tb, Dy, Ho, Er, Tm, Yb or Lu.

6. A semiconductor device according to the claim 1, wherein thicknesses of said metal oxide layers decrease from the gate-electrode side to the silicon-substrate side.

7. A semiconductor device according to the claim 1, wherein one of said silicon oxide layers formed closest to said gate electrode is thinner than another one of said silicon oxide layers formed closest to said silicon substrate.

8. A semiconductor device according to the claim 7, wherein thicknesses of said silicon oxide layers increase from the gate-electrode side to the silicon-substrate side.

9. A semiconductor device provided with a MISFET having:

a semiconductor substrate;
a gate insulating film formed over said semiconductor substrate; and
a gate electrode formed over said gate insulating film;
wherein said gate insulating film includes a first insulating film formed over said semiconductor substrate and a metal silicate layer formed over said first insulating film,
wherein said metal silicate layer is composed of a plurality of silicon oxide layers alternatingly laminated with a plurality of metal oxide layers, each of the plurality of silicon oxide layers being laminated so as to be adjacent to at least one corresponding metal oxide layer,
wherein one of said metal oxide layers formed closest to said gate electrode is thicker than another one of said metal oxide layers formed closest to said silicon substrate, wherein a concentration of silicon in said metal silicate layer is distributed to become higher on a silicon-substrate side than on a gate-electrode side, and wherein a concentration of metal in said metal silicate layer is distributed to become lower on the silicon-substrate side than on the gate-electrode side.

10. A semiconductor device according to the claim 9, wherein said metal oxide layers are formed by an ALD (Atomic Layer Deposition) method.

11. A semiconductor device according to the claim 9, wherein said first insulating film is formed of a silicon oxide film.

12. A semiconductor device according to the claim 9, wherein said metal oxide layers include Hf.

13. A semiconductor device according to the claim 9, wherein said metal oxide layers include one of Zr, Ta, Al, Ti, Nb, Sc, Y, La, Ce, Pr, Nd, Sm, Eu, Cd, Tb, Dy, Ho, Er, Tm, Yb or Lu.

14. A semiconductor device according to the claim 9, wherein thicknesses of said metal oxide layers decrease from the gate-electrode side to the silicon-substrate side.

15. A semiconductor device according to the claim 9, wherein one of said silicon oxide layers formed closest to said gate electrode is thinner than another one of said silicon oxide layers formed closest to silicon substrate.

16. A semiconductor device according to the claim 15, wherein thicknesses of said silicon oxide layers increase from the gate-electrode side to the silicon-substrate side.

* * * * *

UNITED STATES PATENT AND TRADEMARK OFFICE
CERTIFICATE OF CORRECTION

PATENT NO. : 7,397,094 B2
APPLICATION NO. : 11/114195
DATED : July 8, 2008
INVENTOR(S) : Nabatame et al.

It is certified that error appears in the above-identified patent and that said Letters Patent is hereby corrected as shown below:

On the title page Item (73) please delete:

"Renesas Technology Corporation, Tokyo (JP); National Institute of Advanced Industrial Science and Technology, Tokyo (JP); Rohm Co., Ltd., Kyoto (JP) and Horiba., Ltd. Kyoto (JP)"

and insert:

-- Renesas Technology Corp., Tokyo (JP); National Institute of Advanced Industrial Science and Technology, Tokyo (JP); Rohm Co., Ltd., Kyoto (JP) and Horiba, Ltd. Kyoto (JP) --

Signed and Sealed this
Seventeenth Day of June, 2014

Michelle K. Lee
*Deputy Director of the United States Patent and Trademark Office*